US012795863B2

(12) United States Patent
Chang et al.

(10) Patent No.: US 12,795,863 B2
(45) Date of Patent: Nov. 10, 2026

(54) IMMERSION COOLING SYSTEM

(71) Applicant: Delta Electronics, Inc., Taoyuan City (TW)

(72) Inventors: Ren-Chun Chang, Taoyuan City (TW); Wei-Chih Lin, Taoyuan City (TW); Sheng-Chi Wu, Taoyuan City (TW); Wen-Yin Tsai, Taoyuan City (TW); Li-Hsiu Chen, Taoyuan City (TW)

(73) Assignee: Delta Electronics, Inc., Taoyuan City (TW)

( * ) Notice: Subject to any disclaimer, the term of this patent is extended or adjusted under 35 U.S.C. 154(b) by 632 days.

(21) Appl. No.: 18/314,466

(22) Filed: May 9, 2023

(65) Prior Publication Data

US 2024/0074119 A1 Feb. 29, 2024

Related U.S. Application Data

(60) Provisional application No. 63/401,365, filed on Aug. 26, 2022.

(30) Foreign Application Priority Data

Dec. 12, 2022 (CN) ......................... 202211592098.5

(51) Int. Cl.
*H05K 7/20* (2006.01)
*H10W 40/30* (2026.01)
*H10W 40/47* (2026.01)

(52) U.S. Cl.
CPC ......... *H05K 7/208* (2013.01); *H05K 7/20327* (2013.01); *H05K 7/20836* (2013.01);
(Continued)

(58) Field of Classification Search
CPC ........................... H05K 7/203; H05K 7/20236
(Continued)

(56) References Cited

U.S. PATENT DOCUMENTS 10,490,329 B2 11/2019 Eguchi et al.
10,966,349 B1 * 3/2021 Lau .................... H05K 7/20318
(Continued)

FOREIGN PATENT DOCUMENTS

CN 208982716 U 6/2019
CN 111447784 A 7/2020
(Continued)

OTHER PUBLICATIONS

An Office Action and Search Report in corresponding TW Application No. 111147527 issued Apr. 12. 2024 are attached, 11 and 1 page respectively.
(Continued)

*Primary Examiner* — Devon Lane
(74) *Attorney, Agent, or Firm* — MUNCY, GEISSLER, OLDS & LOWE, P.C.

(57) ABSTRACT

An immersion cooling system includes a pressure seal tank, an electronic apparatus, a pressure balance pipe and a relief valve. The pressure seal tank is configured to store coolant. A vapor space is formed in the pressure seal tank above the liquid level of the coolant. The electronic apparatus is completely immersed in the coolant. The pressure balance pipe has a gas collection length. The first port of the pressure balance pipe is disposed on the top surface of the pressure seal tank. The relief valve is disposed on the second port of the pressure balance pipe. The second port is farther away from the top surface of the pressure seal tank than the first port. The gas collection length of the pressure equalization tube allows the concentration of vaporized coolant at the first port to be greater than the concentration of vaporized coolant at the second port.

17 Claims, 5 Drawing Sheets

(52) U.S. Cl.
CPC ......... *H05K 7/203* (2013.01); *H05K 7/20536* (2013.01); *H05K 7/20709* (2013.01); *H10W 40/30* (2026.01); *H10W 40/47* (2026.01)

(58) Field of Classification Search
USPC .......................................................... 165/203
See application file for complete search history.

(56) References Cited

U.S. PATENT DOCUMENTS

| | | | | |
|---|---|---|---|---|
| 2020/0154610 | A1* | 5/2020 | Wilks | H05K 7/20818 |
| 2020/0383237 | A1* | 12/2020 | Hashimoto | H05K 7/20272 |
| 2022/0104394 | A1* | 3/2022 | Boyd | H05K 7/20936 |
| 2022/0264761 | A1* | 8/2022 | Keehn | H05K 7/203 |
| 2023/0073646 | A1* | 3/2023 | Gao | H05K 7/20818 |
| 2023/0147728 | A1* | 5/2023 | Archibald | H05K 7/20272<br>361/679.53 |
| 2023/0415612 | A1* | 12/2023 | Dunn | B60K 11/02 |

FOREIGN PATENT DOCUMENTS

| | | |
|---|---|---|
| TW | 202102101 A | 1/2021 |
| TW | 202222139 A | 6/2022 |
| TW | M628465 U | 6/2022 |

OTHER PUBLICATIONS

Taiwan Office Action, issued on Jun. 5, 2023, in Application No. 111147527, 9 pages.
An Office Action in corresponding CN Application No. 202211592098.5 dated Mar. 18, 2026 is attached, 40 pages.

* cited by examiner

IMMERSION COOLING SYSTEM

CROSS REFERENCE TO RELATED APPLICATIONS

This application claims the benefit of U.S. Provisional Application No. 63/401,365, filed Aug. 26, 2022, and claims priority of China Patent Application No. CN202211592098.5, filed on Dec. 12, 2022, the entirety of which are incorporated by reference herein.

BACKGROUND OF THE INVENTION

Field of the Invention

The present invention relates to an immersion cooling system, and, in particular, to an immersion cooling system having a pressure balance pipe.

Description of the Related Art

With the advance of technology, the application of electronic apparatuses has become more and more common. In particular, various communication apparatuses such as server apparatuses have gradually become an indispensable part of daily life. These electronic apparatuses generate a large amount of heat during operation, and therefore currently use immersion cooling systems. However, existing immersion cooling systems still have room for improvement in terms of operating cost and environmental performance.

In a traditional immersion cooling system, the liquid coolant vaporizes during the operation of the electronic apparatus, and therefore the pressure in the tank of the immersion cooling system is increased, forcing open the pressure valve to releasing the pressure. At this point, a large amount of gaseous coolant is released to the outside environment. Generally, gaseous coolants are regarded as greenhouse gases, which are likely to have a negative impact on the environment. For example, a large release of gaseous coolants may not meet GWP (Global Warming Potential) regulations. In addition, the release of a large amount of gaseous coolant may significantly reduce the stock of coolant available for the continued operation of the immersion cooling system, so it is required to dispatch personnel to fill the coolant more frequently, resulting in significantly increased maintenance costs.

Therefore, how to effectively reduce the discharge of gaseous coolant in an immersion cooling system will be an important issue.

BRIEF SUMMARY OF THE INVENTION

An embodiment of the present invention provides an immersion cooling system for a server system. The immersion cooling system includes a pressure seal tank, an electronic apparatus, a pressure balance pipe and a relief valve. The pressure seal tank is configured to store coolant. A vapor space is formed in the pressure seal tank above the liquid level of the coolant. The electronic apparatus is completely immersed in the coolant. The pressure balance pipe has a gas collection length, and the first port of the pressure balance pipe is disposed on the top surface of the pressure seal tank. The relief valve is disposed on the second port of the pressure balance pipe, and the second port is farther away from the top surface of the pressure seal tank than the first port. When the electronic apparatus is in operation, a portion of the coolant vaporizes and therefore the pressure value is increased in the pressure seal tank. When the pressure value in the pressure seal tank exceeds a first pressure value, the relief valve is automatically opened, so that the vapor space is communicated with the environment outside the pressure seal tank along the gas collection length of the pressure balance pipe. The gas collection length of the pressure equalization tube allows the concentration of vaporized coolant at the first port to be greater than the concentration of vaporized coolant at the second port.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The supporting mechanisms of some embodiments of the present disclosure are described in the following description. However, it should be appreciated that the following detailed description of some embodiments of the disclosure provides various concepts of the present disclosure which may be performed in specific backgrounds that can vary widely. The specific embodiments disclosed are provided merely to clearly describe the usage of the present disclosure by some specific methods without limiting the scope of the present disclosure.

In addition, spatially relative terms, such as "lower," or "bottom," and "upper," or "top," may be used herein to describe one element or feature's relationship to another element or feature as illustrated in the figures. It should be understood that if the figures are turned upside-down, the element located on the "lower" side may become the element located on the "upper" side.

It should be appreciated that although the terms "first" and "second" may be used herein to describe various elements, materials and/or portions, these elements, materials and/or portions should not be limited by these terms. These terms are merely intended to distinguish different elements, materials and/or portions. Accordingly, a first element, material and/or portion discussed as follows may be referred to as a second element, material and/or portion without departing from the teaching of some embodiments in the present disclosure.

Unless defined otherwise, all terms (including technical and scientific terms) used herein have the same meaning as commonly understood by one of ordinary skill in the art to which this disclosure belongs. It should be appreciated that, in each case, the term, which is defined in a commonly used dictionary, should be interpreted as having a meaning that conforms to the relative skills of the present disclosure and the background or the context of the present disclosure, and should not be interpreted in an idealized or overly formal manner unless so defined in the present disclosure. In addition, the terms "substantially," "about" or "approximately" may be recited herein, and are intended to encompass the circumstances or ranges that are substantially the same and exactly the same. It should be noted that unless specially defined, even if the above terms are not recited in the description, it should be interpreted as the same meaning as the above approximate terms that are recited.

Figure 1:
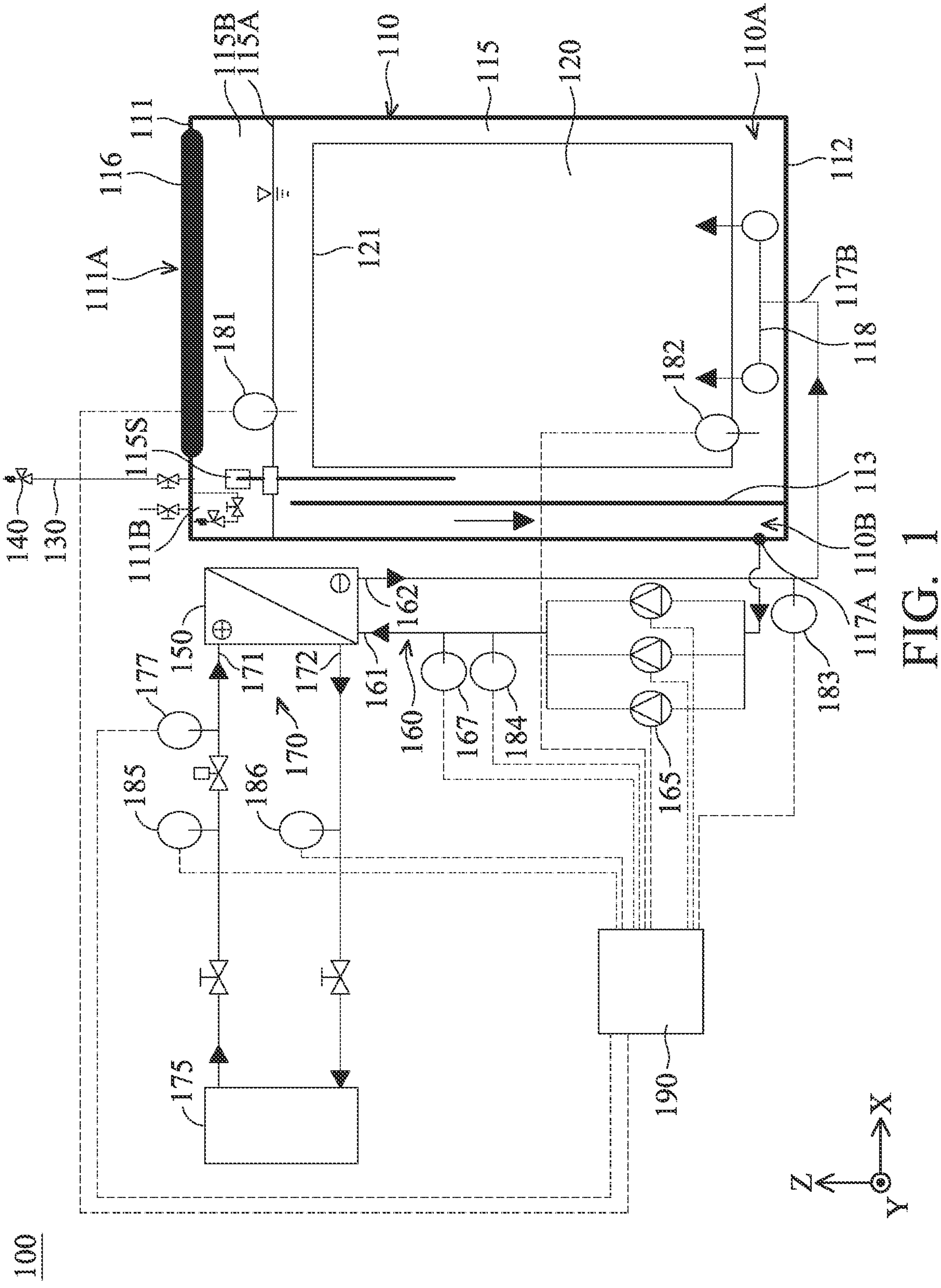
FIG. 1 illustrates a schematic view of an immersion cooling system in accordance with some embodiments of the present disclosure.

Referring to FIG. 1 first, FIG. 1 illustrates a schematic view of an immersion cooling system 100 in accordance with some embodiments of the present disclosure. In some embodiments, the immersion cooling system 100 may be provided, for example, for a server system, but the present disclosure is not limited thereto. As shown in FIG. 1, the immersion cooling system 100 may include a pressure seal tank 110, an electronic apparatus 120, a pressure balance pipe 130 and a relief valve 140. In some embodiments, the pressure seal tank 110 may have a top surface 111, a bottom 112 and a partition wall 113. The partition wall 113 is vertically disposed on the bottom 112 in the pressure seal tank 110, so that the pressure seal tank 110 is divided into a first accommodating space 110A and a second accommodating space 110B inside. In some embodiments, the first accommodating space 110A is larger than the second accommodating space 110B, but the present disclosure is not limited thereto.

The pressure seal tank 110 may be configured to store the coolant 115 and the electronic apparatus 120. The coolant 115 may be located in the first accommodation space 110A and the second accommodation space 110B at the same time. For example, the coolant 115 may include fluorine-containing compounds or other suitable polymer compounds, but the present disclosure is not limited thereto. The electronic apparatus 120 may be disposed in the first accommodating space 110A and completely immersed in the coolant 115. As a result, the heat generated by the electronic apparatus 120 can be taken away by the flow of the coolant 115, so that the electronic apparatus 120 can be kept at an appropriate working temperature, and therefore the failure probability of the electronic apparatus 120 due to overheat can be reduced. For example, the electronic apparatus 120 may include a plurality of electronic devices (such as server devices, which are not shown separately), but the present disclosure is not limited thereto.

In some embodiments, the height of the partition wall 113 is lower than the liquid level 115A and higher than the top surface 121 of the electronic apparatus 120. In addition, the top surface 111 of the pressure seal tank 110 has an opening 111A, the opening 111A is adjacent to the pressure balance pipe 130 and can be communicated with the first accommodating space 110A. The electronic apparatus 120 is placed into the pressure seal tank 110 through the opening 111A. The immersion cooling system 100 further includes a sealing cover 116 for sealing the opening 111A such that a vapor space 115B may be formed above the liquid level 115A of the coolant 115.

In some embodiments, the vapor space 115B is formed above the liquid level 115A of the coolant 115 in the pressure tight tank 110. More specifically, when the electronic apparatus 120 is in operation, a portion of the coolant 115 vaporizes, and the vapor is in the vapor space 115B. As a result, the saturated vapor pressure of the coolant 115 will increase the pressure value (which is, for example, the sum of atmospheric pressure and the saturated vapor pressure of the coolant 115) in the pressure seal tank 110.

In order to reduce the probability of damage to the pressure seal tank 110 due to an excessively high internal pressure, a relief valve 140 is provided to communicate with the pressure seal tank 110. By opening and closing the relief valve 140, the pressure value in the pressure seal tank 110 can be kept within an acceptable range. In the present embodiment, a pressure balance pipe 130 is connected between the relief valve 140 and the pressure seal tank 110. When the pressure value in the pressure seal tank 110 exceeds a first pressure value (for example, about 103 kPa), the relief valve 140 is automatically opened, so that the vapor space 115B is communicated with an environment outside the pressure seal tank 110 through the pressure balance pipe 130. Otherwise, when the pressure value inside the pressure seal tank 110 is lower than a second pressure value (for example, about 101.5 kPa), the relief valve 140 is automatically closed, so that the vapor space 115B is isolated from the environment outside the pressure seal tank 110. It should be understood that the first pressure value is greater than the second pressure value, and the pressure value in the pressure seal tank 110 can be kept between the first pressure value and the second pressure value with the above design.

Generally, the coolant 115 used in the immersion cooling system 100 is a polymer fluoride, and its molecular weight may be from about 250 kg/kmole to about 700 kg/kmole, which is much higher than the molecular weight of air (28.9 kg/kmole). Accordingly, once the coolant 115 vaporizes, the vapor density of the coolant 115 is about 10 to 25 times that of air. Therefore, after the coolant 115 forms vapor and mixes with the air, because of the density difference between the vaporized coolant 115 and the air, the vapor concentration of the coolant 115 will gradually decrease as the height increases. The pressure balance pipe 130 is disposed between the top of the pressure seal tank 110 and the relief valve 140, and the height of the pressure balance pipe 130 can be designed according to the concentration distribution of the coolant 115. As a result, once the relief valve 140 is opened to discharge gas (which includes air and the vapor of coolant 115) for reducing the pressure value in the pressure seal tank 110, the gas can be discharged at a relatively high position with the arrangement of the pressure balance pipe 130, and therefore the vapor of coolant 115 is discharged under a relatively low concentration. Further description will be provided below with reference to FIG. 2.

As mentioned above, the arrangement of the pressure balance pipe 130 may reduce the amount of vapor of the coolant 115 discharged to the outside of the pressure seal tank 110 via the relief valve 140, thereby reducing the maintenance cost of the immersion cooling system 100. Specifically, if the vaporized coolant 115 is discharged from the relief valve 140 along with the air in the pressure seal tank 110, the coolant 115 in the pressure seal tank 110 needs to be replenished frequently (for example, the coolant 115 is replenished via the coolant supplement port 111B on the top surface 111 of the pressure seal tank 110). In addition, since the components of the existing coolant 115 are generally regarded as greenhouse gases, reducing the vaporized coolant 115 also meets the trend of environmental protection.

In addition, the coolant outlet 117A is disposed at the bottom of the second accommodating space 110B, and is spatially opposite to (for example, facing) the partition wall 113. In some embodiments, the immersion cooling system 100 further includes a heat exchanger 150, and the heat exchanger 150 includes a coolant circulation loop 160 and a water circulation loop 170. The coolant circulation loop 160 has an inlet 161 and an outlet 162. The inlet 161 may be connected to the coolant outlet 117A to receive coolant 115 into heat exchanger 150. The water circulation loop 170 has an inlet 171 and an outlet 172, and the inlet 171 may be connected to a water tower 175 to receive cold water into the heat exchanger 150. In this way, with the water circulation loop 170 and the coolant circulation loop 160, the coolant 115 may exchange heat with the cold water in the heat exchanger 150, so that the temperature of the coolant 115 in the coolant circulation loop 160 drops. After the heat exchange, the coolant 115 may leave the coolant circulation loop 160 via the outlet 162, and the water may leave the water circulation loop 170 via the outlet 172.

In some embodiments, the pump 165 is connected between the inlet 161 of the coolant circulation loop 160 and the coolant outlet 117A. In some embodiments, the pump 165 outputs power so that the coolant 115 in the second accommodating space 110B flows into the inlet 161 of the coolant circulation loop 160 via the coolant outlet 117A. In addition, a liquid distributor 118 is disposed to connect between the outlet 162 of the coolant circulation loop 160 and the bottom of the electronic apparatus 120. After the coolant 115 completes the heat exchange in the heat exchanger 150, the power output by the pump 165 may make the coolant 115 in the coolant circulation loop 160 to flow into the liquid distributor 118 via the outlet 162 of the coolant circulation loop 160 and the coolant inlet 117B (for example, located at the bottom 112) of the pressure seal tank 110. With the power output by the pump 165, the liquid distributor 118 may evenly distribute the coolant 115 into the first accommodating space 110A, flowing through the interior of the electronic apparatus 120 (such as the surfaces of the plurality of electronic devices disposed therein).

As set forth above, due to the absorption of heat energy from the electronic apparatus 120, the temperature of the coolant 115 flowing through the electronic apparatus 120 will rise. The heated coolant 115 is less effective for cooling the electronic apparatus 120. At this time, with the power output by the pump 165, the heated coolant 115 will flow over the partition wall 113 to the second accommodating space 110B, and pass through the coolant outlet 117A to the heat exchanger 150 for heat exchange (cooling). Then, the cooled coolant 115 will enter the liquid distributor 118 via the coolant inlet 117B, and re-inject into the pressure-tight tank 110 to complete the circulation of the coolant 115. In this way, the re-injected coolant 115 may regain the effect of cooling the electronic apparatus 120.

In some embodiments, a first flow meter 167 may be disposed between the inlet 161 of the coolant circulation loop 160 and the pump 165 to detect whether the flow rate of the coolant 115 is within an acceptable range. Similarly, a second flow meter 177 may be disposed between the inlet 171 of the water circulation loop 170 and the water tower 175 to detect whether the flow rate of the cold water is within an acceptable range. The immersion cooling system 100 has a controller 190. When the controller 190 detects that the flow rate of the coolant 115 and/or the cooling water exceeds a threshold value, the controller 190 will output a warning signal to notify the personnel to check that the pipelines are well-connected.

In some embodiments, the immersion cooling system 100 further includes a first temperature sensor 181 that is disposed on the top of the electronic apparatus 120 and configured to detect the first temperature of the coolant 115. In addition, the immersion cooling system 100 further includes a second temperature sensor 182 that is disposed at the bottom of the electronic apparatus 120 and configured to detect the second temperature of the coolant 115. The controller 190 of the immersion cooling system 100 may obtain a first temperature difference between the first temperature and the second temperature. Specifically, the above-mentioned first temperature difference may represent a temperature difference before and after the coolant 115 flows through the electronic apparatus 120 (that is, before and after the coolant 115 exchanges heat with the electronic apparatus 120). In some embodiments, when the controller 190 detects that the first temperature difference is less than or equal to a temperature threshold, the controller 190 reduces the output power of the pump 165. In this way, unnecessary circulation of the coolant 115 can be reduced, thereby reducing the operating cost of the immersion cooling system 100.

Furthermore, the immersion cooling system 100 further includes a third temperature sensor 183 that is disposed on the pipeline connecting the outlet 162 of the coolant circulation loop 160 and the liquid distributor 118, and is configured to detect a third temperature of the coolant 115. The immersion cooling system 100 further includes a fourth temperature sensor 184 that is disposed on the pipeline connecting the inlet 161 of the coolant circulation loop 160 and the pump 165, and is configured to detect a fourth temperature of the coolant 115. In this way, if the controller 190 fails to obtain the first temperature difference between the first temperature and the second temperature, the controller 190 may obtain the second temperature difference between the third temperature and the fourth temperature as a back-up plan. When the controller 190 detects that the second temperature difference is less than or equal to the temperature threshold, the controller 190 reduces the power output by the pump 165. As a result, unnecessary circulation of the coolant 115 can be reduced, thereby reducing the operating cost of the immersion cooling system 100.

In some embodiments, the immersion cooling system 100 further includes a fifth temperature sensor 185 that is disposed on the pipeline connecting the inlet 171 of the water circulation loop 170 and the water tower, and is configured to detect a fifth temperature of the water. The immersion cooling system 100 further includes a sixth temperature sensor 186 that is disposed on the pipeline connecting the outlet 172 of the water circulation loop 170 and the water tower, and is configured to detect a sixth temperature of the water. If the controller 190 fails to obtain the first temperature difference and the second temperature difference, the controller 190 obtains a third temperature difference between the fifth temperature and the sixth temperature as a back-up plan. When the controller detects that the third temperature difference is less than or equal to the temperature threshold, the controller 190 reduces the power output by the pump 165. As a result, unnecessary circulation of the coolant 115 can be reduced, thereby reducing the operating cost of the immersion cooling system 100.

In some embodiments, the immersion cooling system 100 further includes a water-level sensor 115S for detecting the position of the liquid level 115A of the coolant 115. The controller 190 can detect whether the liquid level is lower than the top surface 121 of the electronic apparatus 120 by using the water-level sensor 115S. When the controller 190 detects that the liquid level 115A is lower than the top surface 121 of the electronic apparatus 120, the controller 190 will output a warning signal to notify the personnel to replenish the coolant 115 to maintain the cooling effect on the electronic apparatus 120.

Figure 2:
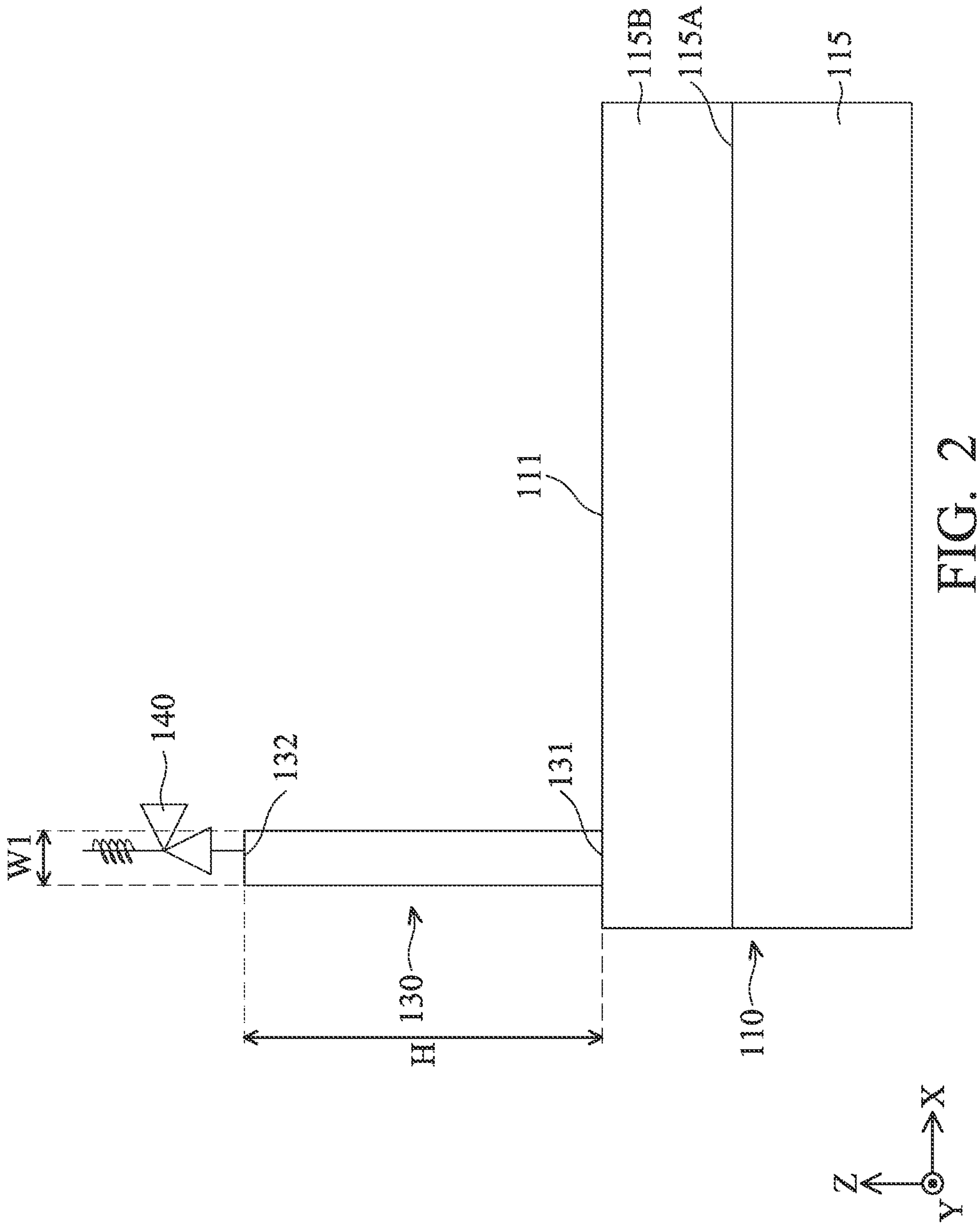
FIG. 2 illustrates a partial enlarged view of the immersion cooling system in accordance with some embodiments of the present disclosure.

FIG. 2 shows a partial enlarged view of the immersion cooling system 100 in accordance with some embodiments of the present disclosure. It should be understood that, for the sake of brevity, a partial structure of the pressure seal tank 110 is shown in this embodiment. Those skilled in the art should be able to combine the structure of this embodiment with the pressure seal tank 110 shown in FIG. 1 according to the content of the present disclosure. As shown in FIG. 2, the first port 131 of the pressure balance pipe 130 is disposed on the top surface 111 of the pressure seal tank 110. The relief valve 140 is disposed at the second port 132 of the pressure balance pipe 130, and the second port 132 is away from the top surface 111 of the pressure seal tank 110 relative to the first port 131.

The pressure balance pipe 130 has a gas collection length H and a width W1. The gas collection length H of the pressure balance pipe 130 can make the concentration of the vaporized coolant at the first port 131 greater than the concentration of the vaporized coolant at the second port 132. For example, the concentration of the vaporized coolant at the first port 131 is at least 20% greater than the concentration of the vaporized coolant at the second port 132. In some embodiments, the gas collection length H of the pressure balance pipe 130 is between 200 mm and 1500 mm, but the present disclosure is not limited thereto. For example, the gas collection length H of the pressure balance pipe 130 may be the distance measured from the first port 131 to the second port 132 in a vertical direction (such as the Z axis). Specifically, the gas collection length H of the pressure balance pipe 130 is changeable depending upon the type of the coolant 115, as long as the concentration of the vaporized coolant at the first port 131 is greater than that at the second port 132 and the amount of the vaporized coolant 115 discharged via the relief valve 140 is effectively reduced. In addition, the pressure balance pipe 130 may have any suitable cross-sectional shape in a horizontal plane (for example, the X-Y plane), such as rectangle, circle, polygon, other regular or irregular shapes, etc.

Figure 3:
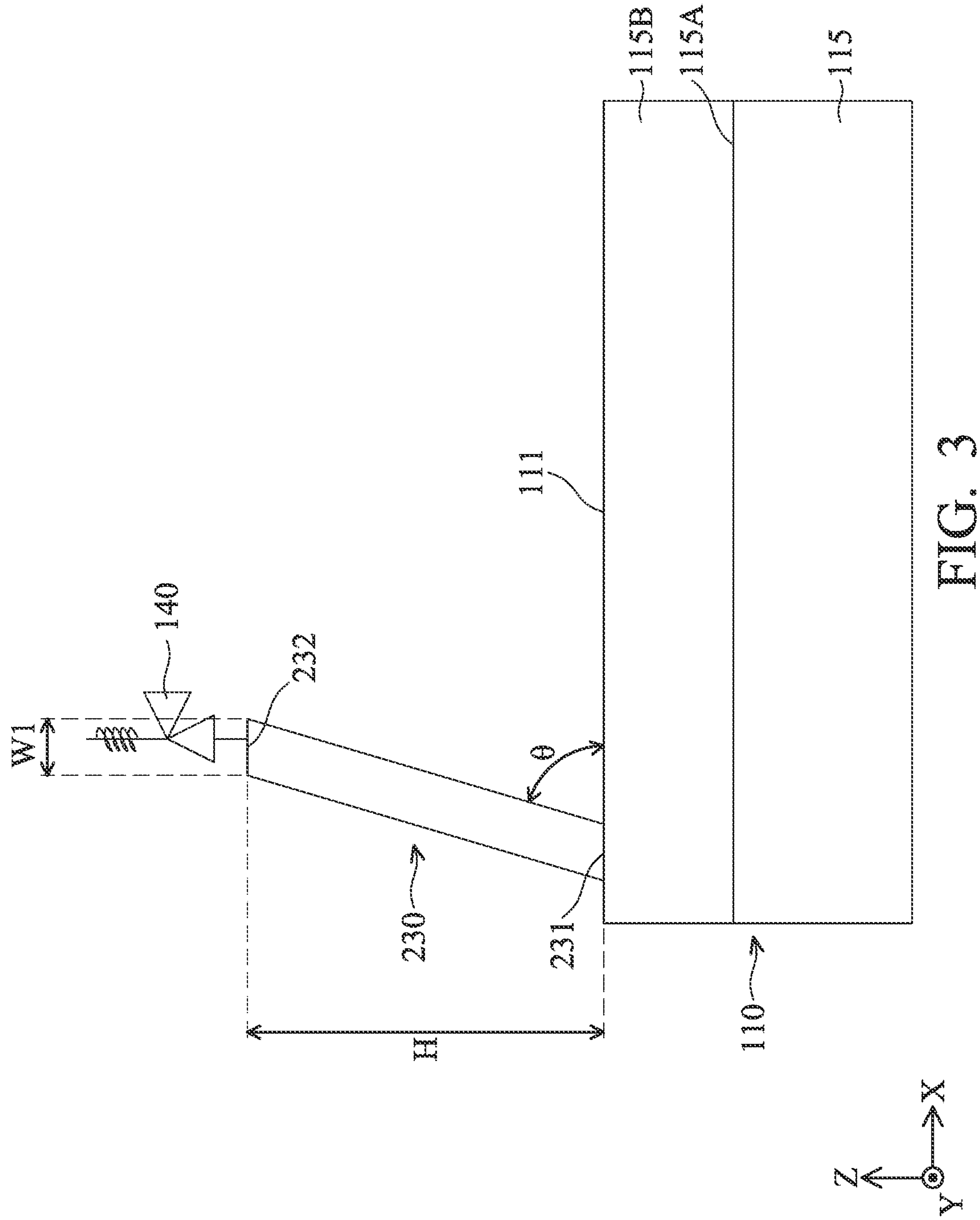
FIG. 3 illustrates a partial enlarged view of the immersion cooling system in accordance with some embodiments of the present disclosure.

FIG. 3 shows a partial enlarged view of the immersion cooling system 100 in accordance with some embodiments of the present disclosure. It should be understood that, for the sake of brevity, a partial structure of the pressure seal tank 110 is shown in this embodiment. Those skilled in the art should be able to combine the structure of this embodiment with the pressure seal tank 110 shown in FIG. 1 according to the content of the present disclosure. As shown in FIG. 3, a pressure balance pipe 230 is disposed instead of the pressure balance pipe 130. The first port 231 of the pressure balance pipe 230 is disposed on the top surface 111 of the pressure seal tank 110. The relief valve 140 is disposed on the second port 232 of the pressure balance pipe 230, and the second port 232 is away from the top surface 111 of the pressure seal tank 110 relative to the first port 231.

In some embodiments, an angle θ that is not a right angle may be formed between the sidewall of the pressure balance pipe 230 and the top surface 111 of the pressure seal tank 110. In other words, the angle θ can be an acute angle or an obtuse angle. For example, the gas collection length H of the pressure balance pipe 230 may be the distance measured from the first port 231 to the second port 232 in the vertical direction (such as the Z axis). The above design can effectively reduce the amount of the vaporized coolant 115 that is discharged via the relief valve 140.

Figure 4:
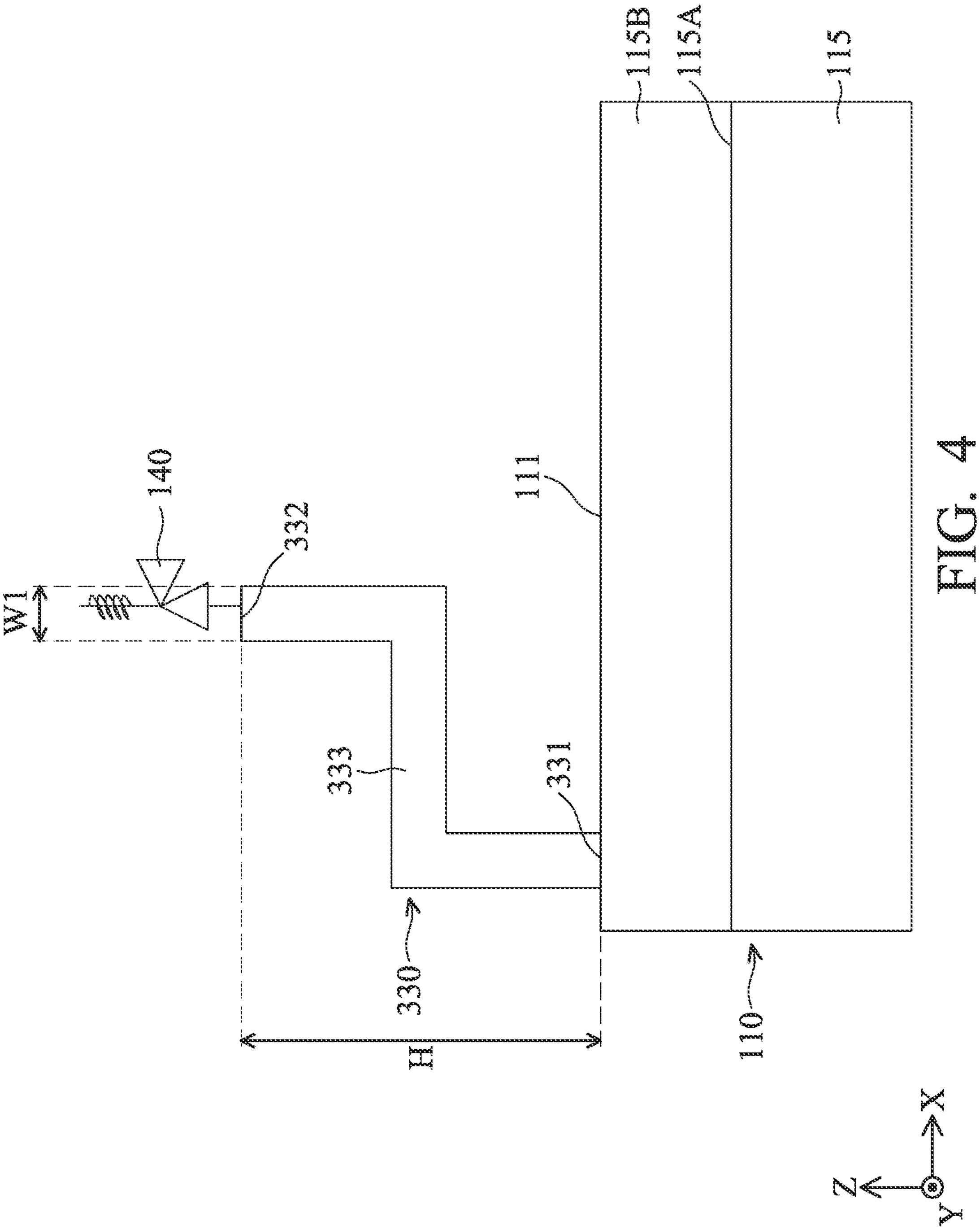
FIG. 4 illustrates a partial enlarged view of the immersion cooling system in accordance with some embodiments of the present disclosure.

FIG. 4 shows a partial enlarged view of the immersion cooling system 100 in accordance with some embodiments of the present disclosure. It should be understood that, for the sake of brevity, a partial structure of the pressure seal tank 110 is shown in this embodiment. Those skilled in the art should be able to combine the structure of this embodiment with the pressure seal tank 110 shown in FIG. 1 according to the content of the present disclosure. As shown in FIG. 4, a pressure balance pipe 330 is disposed to replace the pressure balance pipe 130. The first port 331 of the pressure balance pipe 330 is disposed on the top surface 111 of the pressure seal tank 110. The relief valve 140 is disposed at the second port 332 of the pressure balance pipe 330, and the second port 332 is away from the top surface 111 of the pressure seal tank 110 relative to the first port 331.

In some embodiments, a bent portion 333 may be disposed between the first port 331 and the second port 332 of the pressure balance pipe 330. In the present embodiment, the bending portion 333 may extend in a direction that is parallel to a horizontal plane (such as the X-Y plane). In some embodiments, the bending portion 333 may extend in a direction that is not parallel to the vertical direction (such as the Z axis). For example, the gas collection length H of the pressure balance pipe 330 may be the distance measured from the first port 331 to the second port 332 in the vertical direction (such as the Z axis). The above design can effectively reduce the amount of the vaporized coolant 115 that is discharged via the relief valve 140.

Figure 5:
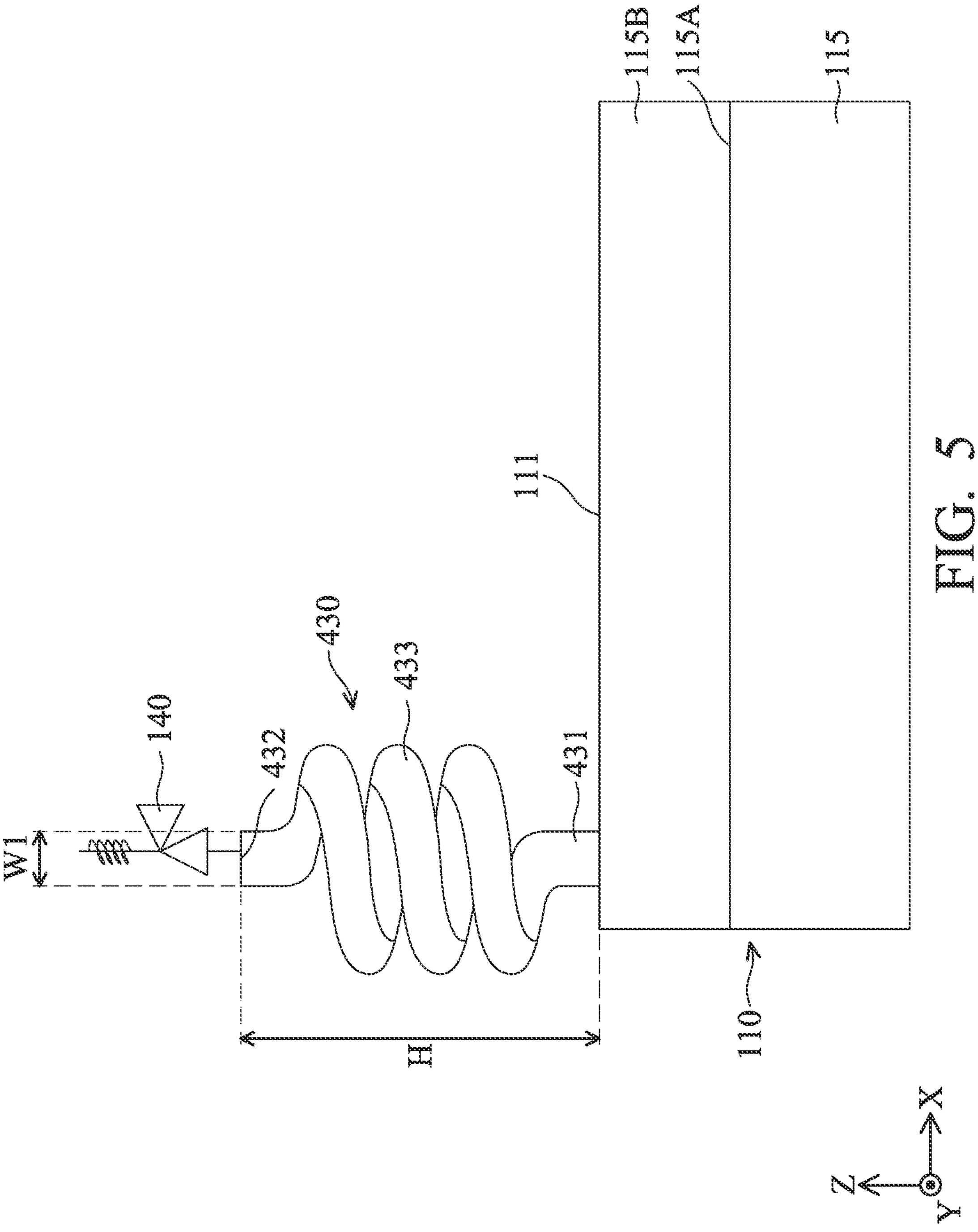
FIG. 5 illustrates a partial enlarged view of the immersion cooling system in accordance with some embodiments of the present disclosure.

FIG. 5 shows a partial enlarged view of the immersion cooling system 100 in accordance with some embodiments of the present disclosure. It should be understood that, for the sake of brevity, a partial structure of the pressure seal tank 110 is shown in this embodiment. Those skilled in the art should be able to combine the structure of this embodiment with the pressure seal tank 110 shown in FIG. 1 according to the content of the present disclosure. As shown in FIG. 5, a pressure balance pipe 430 is disposed to replace the pressure balance pipe 130. The first port 431 of the pressure balance pipe 430 is disposed on the top surface 111 of the pressure seal tank 110. The relief valve 140 is disposed at the second port 432 of the pressure balance pipe 430, and the second port 432 is away from the top surface 111 of the pressure seal tank 110 relative to the first port 431.

In some embodiments, a spiral portion 433 may be disposed between the first port 431 and the second port 432 of the pressure balance pipe 430. In this embodiment, the spiral portion 433 may be a spiral structure having a central axis that is parallel to the Z axis. In some embodiments, the central axis of the spiral portion 433 may not be parallel to the Z axis. For example, the gas collection length H of the pressure balance pipe 430 may be the distance measured from the first port 431 to the second port 432 in the vertical direction (such as the Z axis). The above design can effectively reduce the amount of the vaporized coolant 115 that is discharged via the relief valve 140.

In Summary, the present disclosure provides an immersion cooling system with a pressure balance pipe. With the arrangement of the pressure balance pipe, the amount of the vaporized coolant discharged to the outside of the pressure seal tank via the relief valve can be reduced, thereby reducing the maintenance cost of the immersion cooling system. In this way, the coolant in the pressure seal tank does not need to be replenished frequently. In addition, the temperature, liquid level, flow rate, etc. of the coolant can be detected in real time to ensure the normal operation of the immersion cooling system. The immersion cooling system also includes a coolant circulation loop and a water circulation loop, and therefore the heat exchange may be performed to the coolant flowing through the electronic apparatus for reuse.

While the embodiments and the advantages of the present disclosure have been described above, it should be understood that those skilled in the art may make various changes, substitutions, and alterations to the present disclosure without departing from the spirit and scope of the present disclosure. In addition, the scope of the present disclosure is not limited to the processes, machines, manufacture, composition, devices, methods and steps in the specific embodiments described in the specification. Those skilled in the art may understand existing or developing processes, machines, manufacture, compositions, devices, methods and steps from some embodiments of the present disclosure. As long as those may perform substantially the same function in the aforementioned embodiments and obtain substantially the same result, they may be used in accordance with some embodiments of the present disclosure. Therefore, the scope of the present disclosure includes the aforementioned processes, machines, manufacture, composition, devices, methods, and steps. Furthermore, each of the appended claims constructs an individual embodiment, and the scope of the present disclosure also includes every combination of the appended claims and embodiments.

What is claimed is:

1. An immersion cooling system for a server system, comprising:

a pressure seal tank configured to store coolant, wherein a vapor space is formed in the pressure seal tank above a liquid level of the coolant;

an electronic apparatus completely immersed in the coolant;

a pressure balance pipe having a gas collection length, wherein a first port of the pressure balance pipe is disposed on a top surface of the pressure seal tank;

a relief valve disposed on a second port of the pressure balance pipe, wherein the second port is farther away from the top surface of the pressure seal tank than the first port, wherein when the electronic device is in operation, a portion of the coolant vaporizes to increase a pressure value in the pressure seal tank, wherein when the pressure value in the pressure seal tank exceeds a first pressure value, the relief valve is automatically opened, so that the vapor space is communicated with an environment outside the pressure seal tank along the gas collection length of the pressure balance pipe, wherein the gas collection length of the pressure equalization tube allows a concentration of the vaporized coolant at the first port to be greater than a concentration of the vaporized coolant at the second port;

a coolant outlet disposed at a bottom of the pressure seal tank;

a heat exchanger comprising a water circulation loop and a coolant circulation loop, wherein the water circulation loop is connected to a water tower to receive cold water;

a pump connected between an inlet of the coolant circulation loop and the coolant outlet;

a liquid distributor connected between an outlet of the coolant circulation loop and a bottom of the electronic apparatus;

a first temperature sensor, disposed on a top of the electronic apparatus, configured to detect a first temperature of the coolant;

a second temperature sensor, disposed on the bottom of the electronic apparatus, configured to detect a second temperature of the coolant;

a third temperature sensor, disposed in a pipeline connecting the outlet of the coolant circulation loop and the liquid distributor, configured to detect a third temperature of the coolant;

a fourth temperature sensor, disposed in a pipeline connecting the inlet of the coolant circulation loop and the pump, configured to detect a fourth temperature of the coolant;

a controller obtaining a first temperature difference between the first temperature and the second temperature and a second temperature difference between the third temperature and the fourth temperature, wherein when the controller detects that the first temperature difference or the second temperature difference is less than or equal to a temperature threshold, the controller reduces the power output by the pump;

a fifth temperature sensor, disposed in a pipeline connecting an inlet of the water circulation loop and the water tower, configured to detect a fifth temperature of the coolant; and a sixth temperature sensor, disposed in a pipeline connecting an outlet of the water circulation loop and the water tower, configured to detect a sixth temperature of the coolant, wherein if the controller fails to obtain the second temperature difference between the third temperature and the fourth temperature, the controller obtains a third temperature difference between the fifth temperature and the sixth temperature, wherein when the controller detects that the third temperature difference is less than or equal to the temperature threshold, the controller reduces the power output by the pump.

2. The immersion cooling system for the server system as claimed in claim 1, wherein the pressure seal tank comprises:

a partition wall vertically disposed on a bottom of the pressure seal tank, so that the pressure seal tank is divided into a first accommodating space and a second accommodating space, and the first accommodating space is larger than the second accommodating space;

wherein the coolant outlet is disposed at a bottom of the second accommodating space, and spatially opposite to the partition wall, wherein the electronic apparatus is placed in the first accommodating space, and a height of the partition wall is lower than the liquid level and higher than a top surface of the electronic apparatus.

3. The immersion cooling system for the server system as claimed in claim 2, wherein the pump outputs power, so that the coolant in the second accommodating space flows into the inlet of the coolant circulation loop via the coolant outlet;

wherein with the water circulation loop and the coolant circulation loop, the coolant and the cold water perform a heat exchange in the heat exchanger, so that the temperature of the coolant in the coolant circulation loop drops.

4. The immersion cooling system for the server system as claimed in claim 3, wherein when the coolant completes the heat exchange in the heat exchanger, the coolant in the coolant circulation loop flows into the liquid distributor via the outlet of the coolant circulation loop with the power output by the pump;

wherein with the power output by the pump, the liquid distributor evenly distributes the coolant to flow through an interior of the electronic apparatus.

5. The immersion cooling system for the server system as claimed in claim 4, wherein with the power output by the pump, the coolant flowing through the electronic apparatus flows into the first accommodating space.

6. The immersion cooling system for the server system as claimed in claim 3, further comprising a first flow meter disposed between the inlet of the coolant circulation loop and the pump to detect whether the flow rate of the coolant is within an acceptable range.

7. The immersion cooling system for the server system as claimed in claim 3, further comprising a second flow meter disposed between an inlet of the water circulation loop and the water tower to detect whether the flow rate of the cold water is within an acceptable range.

8. The immersion cooling system for the server system as claimed in claim 1, further comprising:

a water-level sensor configured to detect the liquid level of the coolant;

wherein the controller detects whether the liquid level is lower than a top surface of the electronic apparatus using the water-level sensor, wherein when the controller detects that the liquid level is lower than the top surface of the electronic device, the controller outputs a warning signal.

9. The immersion cooling system for the server system as claimed in claim 1, wherein an opening is formed on the top surface of the pressure seal tank, and the opening is adjacent to the first part of the pressure balance pipe port, wherein the electronic apparatus is placed into the pressure seal tank through the opening, wherein the immersion cooling system further comprises a sealing cover, and the sealing cover is configured to seal the opening, so that the vapor space is formed above the liquid level of the coolant.

10. The immersion cooling system for the server system as claimed in claim 1, wherein the gas collection length of the pressure balance pipe is between 200 mm and 1500 mm.

11. The immersion cooling system for the server system as claimed in claim 1, wherein when the pressure value in the pressure seal tank is lower than a second air pressure value, the relief valve is automatically closed so that the vapor space is isolated from the environment outside the pressure seal tank, wherein the first pressure value is greater than the second pressure value.

12. The immersion cooling system for the server system as claimed in claim 1, wherein the concentration of the vaporized coolant at the first port is at least 20% greater than the concentration of the vaporized coolant at the second port.

13. The immersion cooling system for the server system as claimed in claim 1, wherein a coolant supplement port is formed on the top surface of the pressure seal tank.

14. The immersion cooling system for the server system as claimed in claim 1, wherein an acute angle or an obtuse angle is formed between a sidewall of the pressure balance pipe and the top surface of the pressure seal tank.

15. The immersion cooling system for the server system as claimed in claim 1, wherein the pressure balance pipe has a bent portion disposed between the first port and the second port of the pressure balance pipe, and the bending portion is parallel to the top surface of the pressure seal tank.

16. An immersion cooling system for a server system, comprising:

a pressure seal tank configured to store coolant, wherein a vapor space is formed in the pressure seal tank above a liquid level of the coolant;

an electronic apparatus completely immersed in the coolant;

a pressure balance pipe having a gas collection length, wherein a first port of the pressure balance pipe is disposed on a top surface of the pressure seal tank;

a relief valve disposed on a second port of the pressure balance pipe, wherein the second port is farther away from the top surface of the pressure seal tank than the first port, wherein when the electronic device is in operation, a portion of the coolant vaporizes to increase a pressure value in the pressure seal tank, wherein when the pressure value in the pressure seal tank exceeds a first pressure value, the relief valve is automatically opened, so that the vapor space is communicated with an environment outside the pressure seal tank along the gas collection length of the pressure balance pipe, wherein the gas collection length of the pressure equalization tube allows a concentration of the vaporized coolant at the first port to be greater than a concentration of the vaporized coolant at the second port, wherein the pressure balance pipe has a spiral portion disposed between the first port and the second port of the pressure balance pipe.

17. The immersion cooling system for the server system as claimed in claim 16, wherein the spiral portion has a central axis perpendicular to the top surface of the pressure seal tank.

* * * * *